United States Patent
Stanisic et al.

(10) Patent No.: US 6,963,203 B2
(45) Date of Patent: Nov. 8, 2005

(54) METHODS AND APPARATUS FOR ANALYZING HIGH VOLTAGE CIRCUIT BREAKERS

(75) Inventors: Zoran Stanisic, Stockholm (SE); Heinz Wernli, Oberkulm (CH)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/764,243

(22) Filed: Jan. 23, 2004

(65) Prior Publication Data

US 2004/0189319 A1 Sep. 30, 2004

Related U.S. Application Data

(63) Continuation-in-part of application No. 10/403,695, filed on Mar. 31, 2003, now Pat. No. 6,850,072.

(51) Int. Cl.[7] .............................................. G01R 31/02
(52) U.S. Cl. ......................... 324/424; 324/423; 361/113
(58) Field of Search .......................... 218/143; 324/420, 324/421, 422, 423, 424; 361/115

(56) References Cited

U.S. PATENT DOCUMENTS

| | | | |
|---|---|---|---|
| 4,324,959 A | | 4/1982 | Hall et al. |
| 4,326,167 A | * | 4/1982 | Fehr et al. ................... 324/415 |
| 4,937,698 A | * | 6/1990 | Toya et al. ................... 361/86 |
| 5,736,861 A | * | 4/1998 | Keleher et al. ............. 324/424 |
| 6,295,272 B1 | | 9/2001 | Feldman et al. |
| 6,421,167 B1 | | 7/2002 | Cohen et al. |
| 6,472,877 B1 | * | 10/2002 | Sands .......................... 324/423 |
| 6,798,209 B2 | * | 9/2004 | Lavoie et al. ............... 324/424 |

* cited by examiner

Primary Examiner—Vincent Q. Nguyen
Assistant Examiner—Walter Benson
(74) Attorney, Agent, or Firm—Armstrong Teasdale LLP

(57) ABSTRACT

A method for analyzing an electrical contact pair is provided. At least one of the contacts is coupled to a line-side of the contact pair, and at least one of the contacts is coupled to a load-side of the contact pair. The method includes electrically coupling the load-side contact and the line-side contact to electrical ground, applying a test voltage across the contact pair while the line-side contact and load-side contact remain electrically coupled to electrical ground, triggering a contact pair operation timer at a start of a test, detecting at least one of a first closure of the contact pair and a first opening of the contact pair using the test voltage, and determining the timing of the contact pair based upon the operation of the contact pair operation timer.

27 Claims, 6 Drawing Sheets

METHODS AND APPARATUS FOR ANALYZING HIGH VOLTAGE CIRCUIT BREAKERS

CROSS REFERENCE TO RELATED APPLICATIONS

This application is a continuation in part of and claims priority to U.S. patent application Ser. No. 10/403,695, filed Mar. 31, 2003, now U.S. Pat. No. 6,850,072 entitled "Methods and Apparatus for Analyzing High Voltage Circuit Breakers," which is hereby incorporated by reference in its entirety.

BACKGROUND OF THE INVENTION

This invention relates generally to high voltage circuit breakers, and more specifically to methods and systems for analyzing circuit breaker contacts.

During testing of at least some known circuit breakers, a plurality of circuit breaker parameters may be monitored to facilitate determining whether the circuit breaker is operating as designed. One such parameter may be a circuit breaker contact pair status, which may indicate whether the contacts are opened or closed, and an analog position of the circuit breaker contacts.

Timing the main contact and auxiliary contacts may also be indicative of each contact's state. At least some known contacts are timed by inducing a small DC current into a first of the pair of contacts and detecting the current at a second of the contact pair. In one embodiment, the DC current may be recorded such that a current trace may be used to determine the timing of each contact. In an alternative embodiment, the presence or absence of the DC current may be used to start and stop timers to facilitate directly measuring the contact timing. Circuit breaker contact analog position and contact motion may be determined applying a mechanical transducer to the circuit breaker contact mechanism to transfer a motive force to a movable contact of the contact pair.

A high voltage circuit breaker when removed from service for maintenance, testing, or other reason may be grounded on both sides for personnel safety precautions. Circuit breaker contact timing measurements may be affected by induced currents, voltages, or other disturbances in a high voltage environment where circuit breaker measurement typically is performed. Moreover, such disturbances may limit the effectiveness and/or portability of the test equipment. In addition, motion measurement may be complicated by mechanical difficulties when mounting the transducer to the circuit breaker and when measuring rapid mechanical acceleration during circuit breaker operation. Additionally, the material used in fabricating the circuit breaker contact may also adversely affect the timing result.

At least some known circuit breaker designs use contact materials which have a relatively higher contact resistance, such as, for example, graphite, to protect the contact surface from wear during contact arcing. Furthermore, at least some known timing techniques require the removal of grounding cables from the circuit breaker being tested to facilitate enhancing the accuracy of the results. However, removing the grounding cables may reduce an amount of protection provided against injuries that grounding cables provide.

BRIEF DESCRIPTION OF THE INVENTION

In one aspect, a method for analyzing an electrical contact pair is provided. At least one of the contacts is coupled to a line-side of the contact pair and at least one of the contacts is coupled to a load-side of the contact pair. The method includes electrically coupling the load-side contact and the line-side contact to electrical ground, applying a test voltage across the contact pair while the line-side contact and load-side contact remain electrically coupled to electrical ground, triggering a contact pair operation timer at a start of a test, detecting at least one of a first closure of the contact pair and a first opening of the contact pair using the test voltage, and determining the timing of the contact pair based upon the operation of the contact pair operation timer.

In another aspect, a circuit breaker test device for analyzing contacts of a circuit breaker is provided. The circuit breaker test device includes a test voltage source configured to supply a test voltage to a load-side contact and a line-side contact of the circuit breaker, a sensing circuit coupled to the test voltage source, the sensing circuit configured to monitor an output of the test voltage source, a microprocessor coupled to an output of the sensing circuit wherein the microprocessor is configured to receive the output of the sensing circuit, a ground circuit electrically coupled to the load-side contact of the circuit breaker, and a ground circuit electrically coupled to the line-side contact of the circuit breaker.

DETAILED DESCRIPTION OF THE INVENTION

Periodic testing of circuit breakers may include a contact timing test. The timing test continuously measures the circuit breaker contact capacitance, from which the moment of first contact touch, and when the maximum capacitance between the contacts is reached may be determined. Further, the maximum capacitance value, in the function of time, may be used as a start or a stop value in the total operating time measurement.

Additionally, although the herein described methods are described with regard to circuit breaker contacts, it is contemplated that the benefits of the invention accrue to non-circuit breaker contacts such as those contacts typically employed in, for example, but not limited to, relays or switches.

Figure 1:
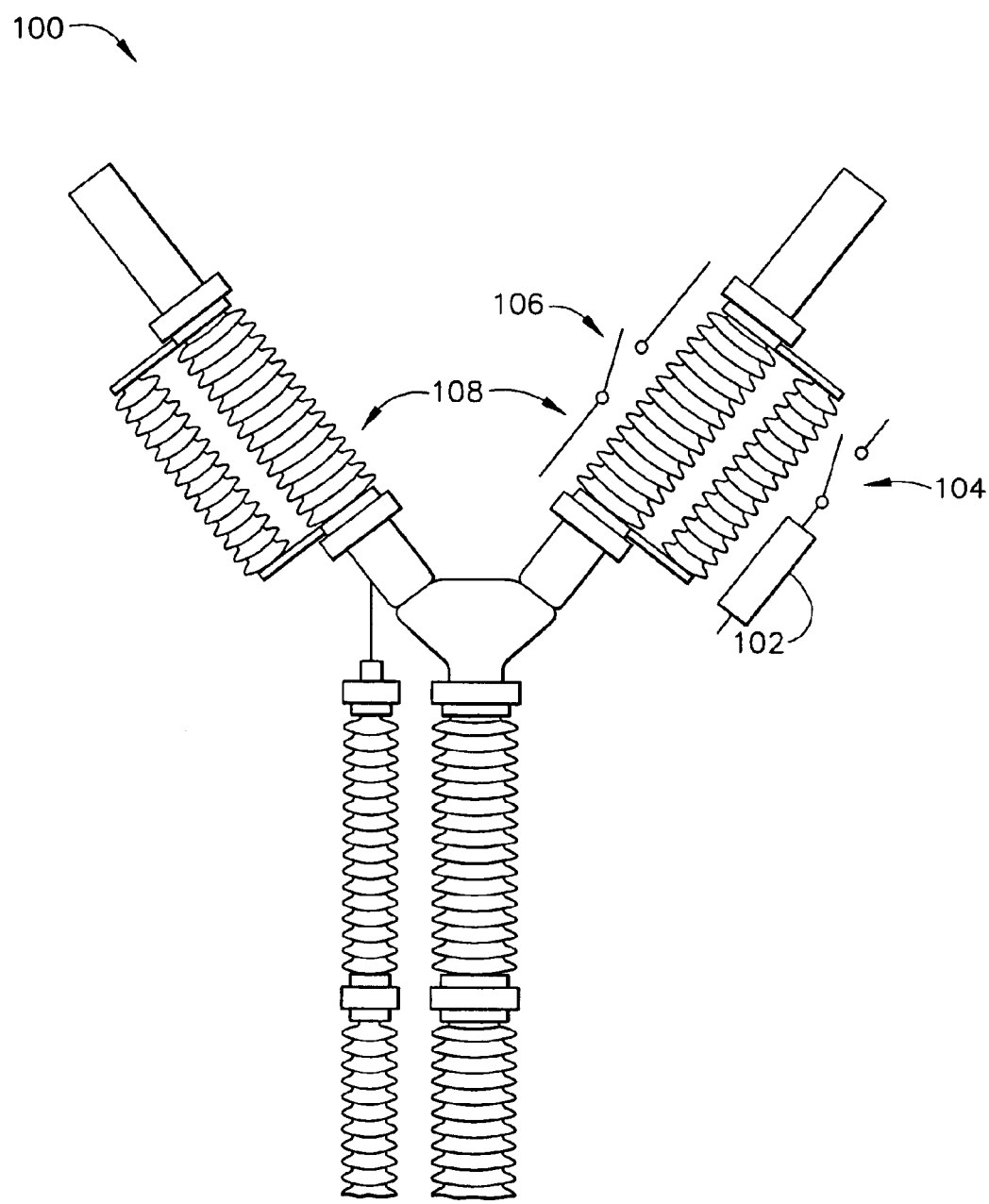
FIG. 1 is a schematic illustration of an exemplary high voltage circuit breaker phase.

FIG. 1 is a schematic illustration of an exemplary high voltage circuit breaker phase 100. A high voltage circuit breaker (not shown) may include a pre-insertion resistor 102 and a moving resistor contact 104 electrically in parallel with a moving main contact 106. In the exemplary embodiment, phase 100 includes two breaks 108 each break 108 includes a pre-insertion resistor (only one shown in FIG. 1).

In operation, from an open position, the circuit breaker receives a command to close, linkages within the circuit breaker cause movable portions of contacts 104 and 106 to move toward engagement of the respective non-movable portions of contacts 104 and 106. During a testing sequence, movement of the movable portion of contacts 104 and 106 may begin a timer. In the exemplary embodiment, the movement of the movable portion of contacts 104 and 106 is detected using electrical parameters associated with contacts 104 and 106. After a predetermined distance of travel of the movable portions of contacts 104 and 106, the movable portion of pre-insertion resistor contact 104 engages a respective non-movable portion. After a predetermined time delay, the movable portion of contact 106 engages a respective non-movable portion of main contact 106. During testing, the timing of circuit breaker contacts 104 and 106 may be determined. In an embodiment wherein there is no pre-insertion resistor 102 only the timing of main contact 106 and auxiliary contacts (not shown) are determined.

Figure 2:
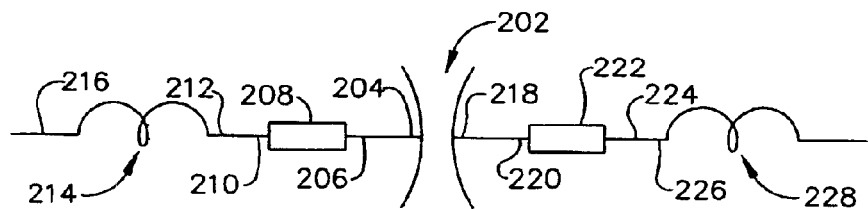
FIG. 2 is a schematic illustration of an exemplary equivalent circuit of a contact pair that may be used in the circuit breaker phase shown in FIG. 1.

FIG. 2 is a schematic illustration of an exemplary equivalent circuit 200 of a contact pair that may be used in circuit breaker phase 100 (shown in FIG. 1). Equivalent circuit 200 includes a capacitor 202 that represents contact surfaces of circuit breaker contacts 104 and 106. During testing, capacitance parameters associated with the circuit breaker contacts, such as, a surface area of each contact surface and a dielectric media surrounding the contact pair each have a constant value. A distance between the contact surfaces of the contact pair is variable based on the contact state, opened or closed, and an amount of travel between fully opened and fully closed. The distance between the contact surfaces is the only capacitance parameter associated with the circuit breaker contacts that substantially varies during operation of the circuit breaker.

A first lead 204 of capacitor 202 is electrically coupled to a first lead 206 of a resistor ($R_a$) 208 and a second lead 210 of resistor ($R_a$) 208 is electrically coupled to a first lead 212 of an inductor ($L_a$) 214. A second lead 216 of inductor ($L_a$) 214 is coupled to a forcing function (not shown) that represents a test signal used to measure the circuit breaker contact timing. Resistor ($R_a$) 208 and inductor ($L_a$) 214 represent the inductance and resistance of the circuit breaker input components. A second lead 218 of capacitor 202 is electrically coupled to a first lead 220 of a resistor ($R_b$) 222 and a second lead 224 of resistor ($R_b$) 222 is electrically coupled to a first lead 226 of an inductor ($L_b$) 228. A second lead of inductor ($L_b$) 228 is coupled to the forcing function return. Resistor ($R_b$) 222 and inductor ($L_b$) 228 represent the inductance and resistance of the circuit breaker output components. Resistors ($R_a$) 208 and ($R_b$) 222, and inductors ($L_a$) 214 and ($L_b$) 228 are represented as constant resistance and inductance values, respectively. Circuit parameters affecting these model components, such as, cable length, diameter and material are substantially constant during testing. The absolute values of resistors ($R_a$) 208 and ($R_b$) 222, and inductors ($L_a$) 214 and ($L_b$) 228 and the steady state value of the contact capacitance are determined by the physical characteristics of each circuit breaker and may vary depending on location and environmental conditions.

During testing, equivalent circuit 200 models the high voltage circuit breaker as a dynamic system with one static and one moveable contact, represented by capacitor 202 that changes capacitance value by the motion of the moveable electrode. By measuring the capacitance dynamically, a minimum distance between circuit breaker contacts before the first contact touch, which corresponds to maximum capacitance in the system may be determined. Additionally, the occurrence of the maximum capacitance value may be used to start and/or stop one or more timers measuring a total operating time (timing) and a recorded capacitance waveform enables analyzing other circuit breaker parameters such as, but not limited to contact motion and interrupting media.

Figure 3:
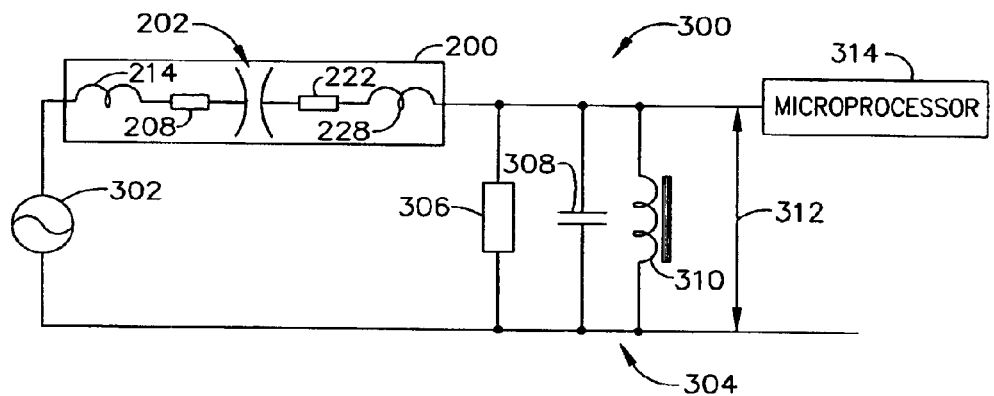
FIG. 3 is a schematic illustration of an exemplary testing circuit that may be used to test a circuit breaker that is represented by the equivalent circuit shown in FIG. 2.

FIG. 3 is a schematic illustration of an exemplary testing circuit 300 that may be used to test a circuit breaker that is represented by equivalent circuit 200 (shown in FIG. 2). Circuit 300 includes a test source that is used to generate a high frequency sine wave signal (Vg(t)) through the circuit breaker contact being measured as represented by circuit 200. In the exemplary embodiment, a frequency is considered to be a high frequency if the frequency is greater than approximately ten kiloHertz. In an alternative embodiment, a frequency is considered to be a high frequency if the frequency is greater than approximately one kiloHertz. A filter 304 is coupled in electrical series to the output of circuit 200. Filter 304 includes a resistor 306, a capacitor 308, and an inductor 310 electrically coupled in parallel to filter noise. In the exemplary embodiment, values of resistance, capacitance and inductance for each respective component in filter 304 is pre-selected to make filter 304 resonant at a frequency that is equal to the frequency of source 302. In an alternative embodiment, the frequency of source 302 is adjusted to a resonant frequency of filter 304. An output voltage ($V_{out}(t)$) 312 of circuit 300 is taken across filter 304. In the exemplary embodiment, output voltage 312 is electrically coupled to a microprocessor 314, which is programmed to receive output voltage 312, analyze data contained within output voltage 312, control voltage source 302, receive commands from an operator, execute scripts that include automatic testing procedures, and generate testing data output. Microprocessor 314 is programmed to analyze output voltage 312 to derive other circuit breaker characteristics indirectly, such as, but not limited to pressure in a contact chamber of the circuit breaker, changes in dielectric constant of gas within the chamber, circuit breaker actuating spring elasticity constant, acceleration of circuit breaker components during operation, vibration of circuit breaker component parts, and an operating time of the circuit breaker.

During testing, with the breaker contacts in an open state, source 302 injects a periodic signal, for example, a sine wave or a non-periodic signal having a shape that includes one or more high frequency component into the circuit breaker. Output 312 receives a signal that corresponds to circuit 200 with a minimum capacitance value for capacitor 202. The minimum capacitance value occurs when circuit breaker contacts represented by capacitor 202 are open. The circuit breaker is commanded to close and the movable contact begins moving toward the non-movable contact. As the movable contact travels closer to the non-movable contact, the capacitance of capacitor 202 increases in relation to the distance traveled. The capacitance value just prior to the time when the movable contact electrically touches the non-movable contact may be used for analysis of contact movement, contact status and other parameters that may indicate that the circuit breaker may not operate as designed. The capacitance as function of time can be calculated using the equation:

$$Vo(t) = Vg(t) - \left\{ (L_a + L_b) \frac{d i_g(t)}{dt} + (R_a + R_b) i_g(t) + \int_{t_0}^{t} \frac{i_g(\tau)}{C(\tau)} d\tau \right\}$$

or by use of a high frequency component, ω, of the signal for every t during breaker operation using the following equation:

$$Vo(\omega, t) = Vg(\omega, t) - \left( j\omega(L_a + L_b) + (R_a + R_b) + \frac{1}{j\omega C(t)} \right) i_g(\omega, t)$$

Then, by equating result to zero, capacitance C is given by:

$$C = \frac{i_g}{Vg - L \frac{d^2 i_g}{dt^2} - R \frac{d i_g}{dt}}$$

Where $L = L_a + L_b$ and $R = R_a + R_b$

The output voltage 312 is electrically coupled to a circuit breaker test device (not shown) that includes a microprocessor for controlling test scripts, computing results from input data, analyzing data received, and generating output displays and printed reports. The term microprocessor, as used herein, refers to microprocessors, microcontrollers, reduced instruction set circuits (RISC), application specific integrated circuits (ASIC), logic circuits, and any other circuit or processor capable of executing the functions described herein. In the exemplary embodiment, testing circuit 300 is a sub-circuit of the testing device positioned within testing device 300. In an alternative embodiment, testing circuit 300 is a separate component electrically couplable to testing device 300, and also configurable to electrically couple to an alternate testing device (not shown).

By using a high frequency test voltage with resonant filtering of the output voltage the circuit breaker contact position may be measured dynamically by measuring the capacitance between the fixed and the moving contacts of the circuit breaker. By measuring the maximum capacitance value, the minimum distance between electrodes may be determined.

Figure 4:
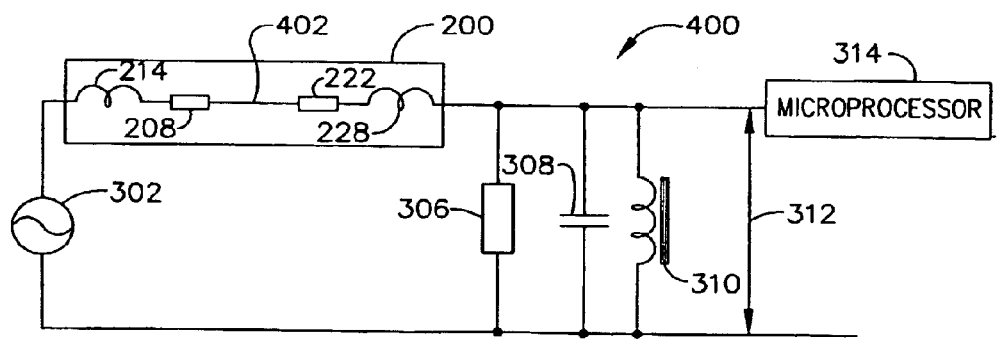
FIG. 4 is a schematic illustration of an equivalent circuit of the testing circuit shown in FIG. 3, illustrated at the time of first contact touch.

FIG. 4 is a schematic illustration of an equivalent circuit 400 of testing circuit 300 (shown in FIG. 3) illustrated at the time of first contact touch. At the time when the movable contact first comes into electrical contact with the non-movable contact, capacitor 202 may be represented as a short circuit 402 and output 312 $V_{out}(t)$ is no longer a monotone function, but becomes a step function with $V_{out}$ as the step value. The time occurrence of the voltage step corresponds to the time the circuit breaker contacts close. This time value may be recorded for use in calculations and may be used to start and stop circuit breaker operational timers. Similarly, during an opening testing sequence, when the circuit breaker contacts first open $V_{out}$ will be a negative step function The capacitance based contact timing circuit may facilitate measuring parameters of high voltage circuit breakers contact systems, such as, but not limited to a start event of the contact geometrical position from the circuit breaker electrically isolated open position, the movement of linear travel of the movable contact, the first electrical touch of each contact, and the penetration as a function of dynamic resistance from the first contact touch to a geometrical end position.

The circuit also facilitates evaluating data from a synchronized time base to comply with standards and calculating circuit breaker parameters and enabling analysis of circuit breaker operation, such as, but not limited to, measuring actual linear movement of each movable contact, measuring a time elapsed from a synchronized start to first touch or last separation of each movable contact, measure a time elapsed from a start event, such as, the contact geometrical position from the circuit breaker electrically isolated open position, to a contact first touch, or a last separation of each contact to an isolated open position, determine a contact velocity in a function of time and movement within above positions, determine overlap, wherein a movement and time elapsed from each contact separation to arcing contact separation at open an operation is measured, and determine a quality of each contact interrupting medium.

Figure 5:
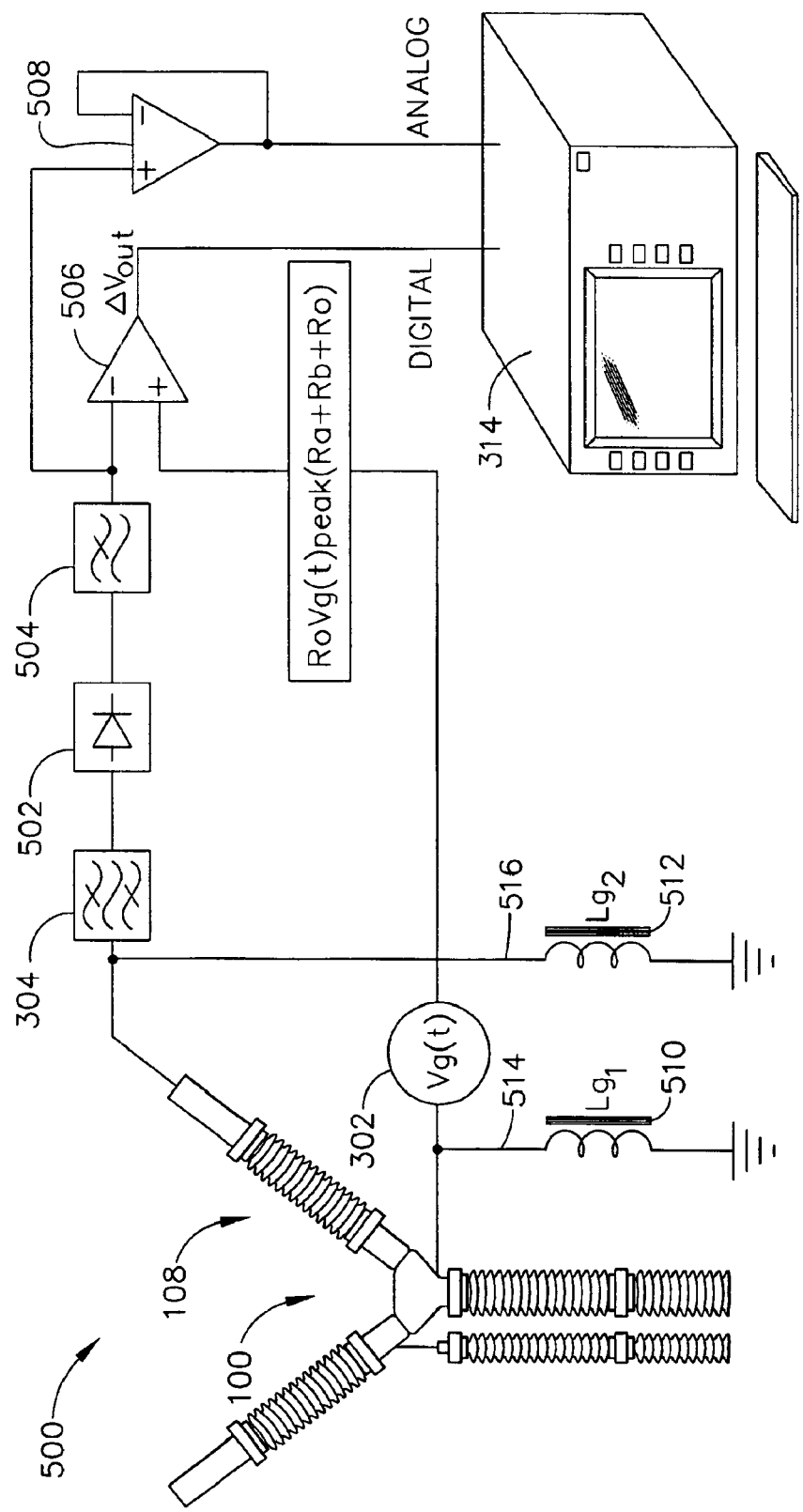
FIG. 5 is a schematic illustration of an exemplary testing circuit that may be used to time the contacts of the circuit breaker phase shown in FIG. 1.

FIG. 5 is a schematic illustration of an exemplary testing circuit 500 that may be used to time the contacts of circuit breaker phase 100 (shown in FIG. 1). During testing, source 302 injects a test signal into circuit breaker contact 106 within break 108. If contact 106 is in an open state, the test signal is transmitting capacitively through contact 106 to the input of resonant filter 304. The filtered output of filter 304 is transmitted to rectifier 502 and low-pass filter 504. The combination of rectifier 502 and low-pass filter 504 envelopes the output of filter 304 to facilitate reducing high frequency noise and facilitate reducing unwanted non-peak related signal information. In the exemplary embodiment, a corner frequency ⅕ of the resonant frequency of capacitor 308 and inductor 310 is used. The signal value from filter 504 is then compared with the voltage value that is greater than RoVg(t)peak/(Ra+Rb+Ro) by comparator 506. The output signal from comparator 506 is equal to $V_{out}$ and is transmitted to a digital input of microprocessor 314 as the "make" or "break" timing result. The output of filter 504 is also transmitted to an input of amplifier 508 to provide an analog output signal to microprocessor 314 for further processing. Inductors 510 and 512 are electrically coupled in series with grounding cables 514 and 516, respectively to drain any currents induced into the circuit breaker circuit. Grounding cables 514 and 516 are applied to the circuit breaker to ensure the personnel safety of operating personnel during testing of the circuit breaker. By introducing an inductance:

$$Lg \gg \frac{1}{\varpi^2 C_{min}}$$

into the circuit breaker grounding cables 514 and 516, the circuit breaker timing measurement may be conducted without disconnecting grounding cables 514 and 516 from the circuit breaker thereby providing greater safety protection to operating personnel.

Figure 6:
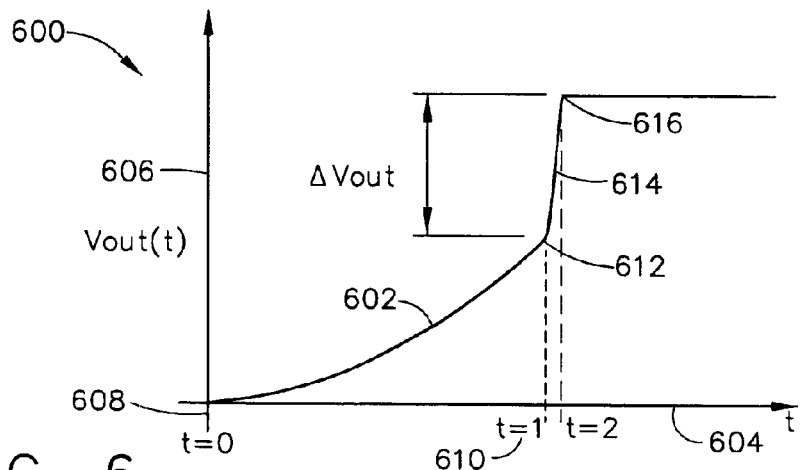
FIG. 6 is a graph of an exemplary trace of the output voltage of the testing circuit during a test procedure.

FIG. 6 is a graph 600 of an exemplary trace 602 of output voltage 312 of testing circuit 300. Graph 600 includes an x-axis 604 indicative of time, and a y-axis 606 that illustrates a magnitude of output voltage 312 at each corresponding unit of time. At t(0) 608, a circuit breaker operating signal is triggered. Between time, t(0) 608 and a time t(1) 610 the circuit breaker movable contact is moving towards the circuit breaker non-movable contact. As the contacts move closer together, the capacitance and hence, the voltage across the contacts increases. The impedance of the contacts may be determined from the equation: $Z=R_a+R_b+\omega(L_a+L_b)+(1/\omega C)$. At time t(1) 610, a first contact is detected by the step jump in $V_{out}$ at point 612. At point 612 a "make" signal is generated based on the detected step jump. During jump 614, a dynamic resistance (Z) between the circuit breaker contacts in motion, termed the penetration process, may be determined based on the equation. $Z=R_a+R_b+\omega(L_a+L_b)$. At a point 616, the dominant impedance on the system becomes the inductance of the circuit breaker cables and may be determined by the equation $Z=\omega(L_a+L_b)$.

Figure 7:
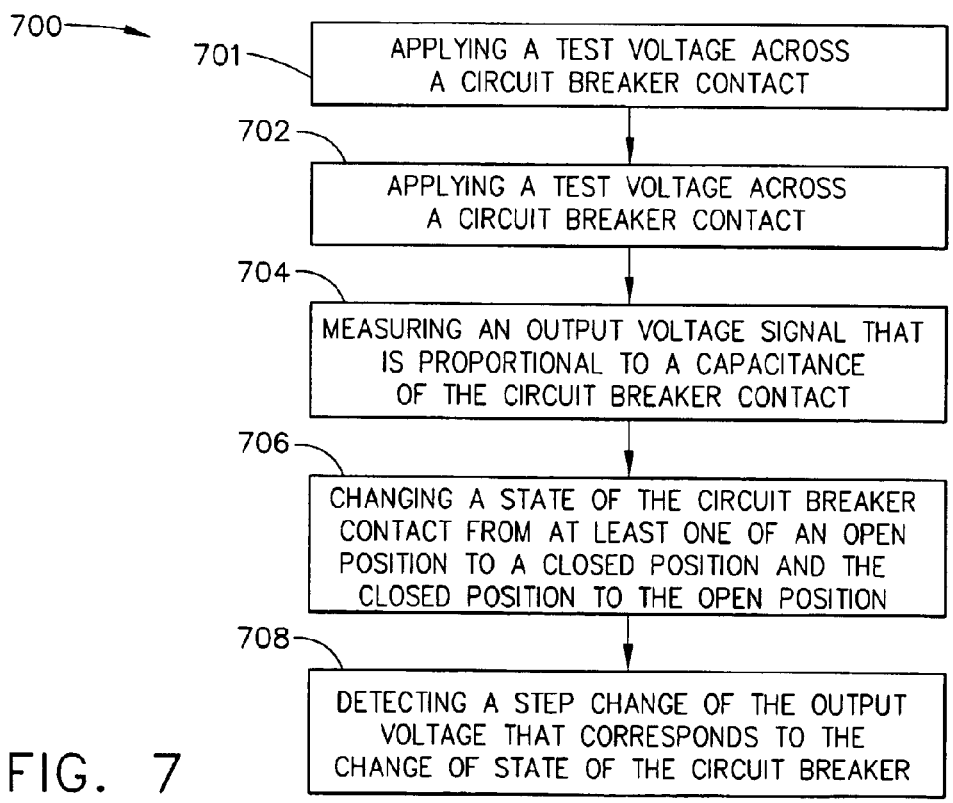
FIG. 7 is a flow diagram of an exemplary method 700 of measuring timing of a circuit breaker while grounding each circuit breaker contact.

FIG. 7 is a flow diagram of an exemplary method 700 for analyzing a circuit breaker. Method 700 includes electrically coupling 701 each circuit breaker contact to electrical ground. A first grounding cable may be coupled to a line side contact of the circuit breaker to a local electrical ground connection. In one embodiment, an inductance of approximately one micro-Henry is coupled in series with the grounding cable. In an alternative embodiment, an inductance of less than approximately one milli-Henry is coupled in series with the grounding cable. Similarly, a second grounding cable may be electrically coupled to a load side of contact of the circuit breaker to a local electrical ground connection. Inductance may be coupled in series with the grounding cable as described above. A test voltage is applied across the circuit breaker contact pair. In the exemplary embodiment, the test voltage is a high frequency sine wave signal. The frequency of the test signal is selected to match the resonant frequency of the circuit breaker contact and filter circuit, which are electrically coupled in series with the source. Alternatively, impedance values of the components of the filter circuit may be selected such that the resonant frequency of the filter matches the output frequency of the test source. During testing, the output voltage taken across the filter circuit is proportional to a capacitance value of the circuit breaker contact. Accordingly, measuring 704 an output voltage of the testing circuit provides indication of the capacitance of the circuit breaker contact. The gap defined between each contact determines the capacitance of the circuit breaker contact. The state of the circuit breaker contact is changed 706 from an open position to a closed position or the closed position to the open position by automatic action taken by a microprocessor executing within the test device or by a manual command initiated by an operator. As the movable contact of the circuit breaker contact pair moves relative to the non-movable contact, the capacitance between the contacts changes proportionally with respect to the distance separating the contacts. As the contacts engage the testing circuit configuration changes such that the output voltage changes by a step amount. The step change is detected 708 in the output voltage that corresponds to the change of state of the circuit breaker. An output signal at the time of the step change is generated for use in analyzing a condition of the circuit breaker contacts and dielectric medium.

Figure 8:
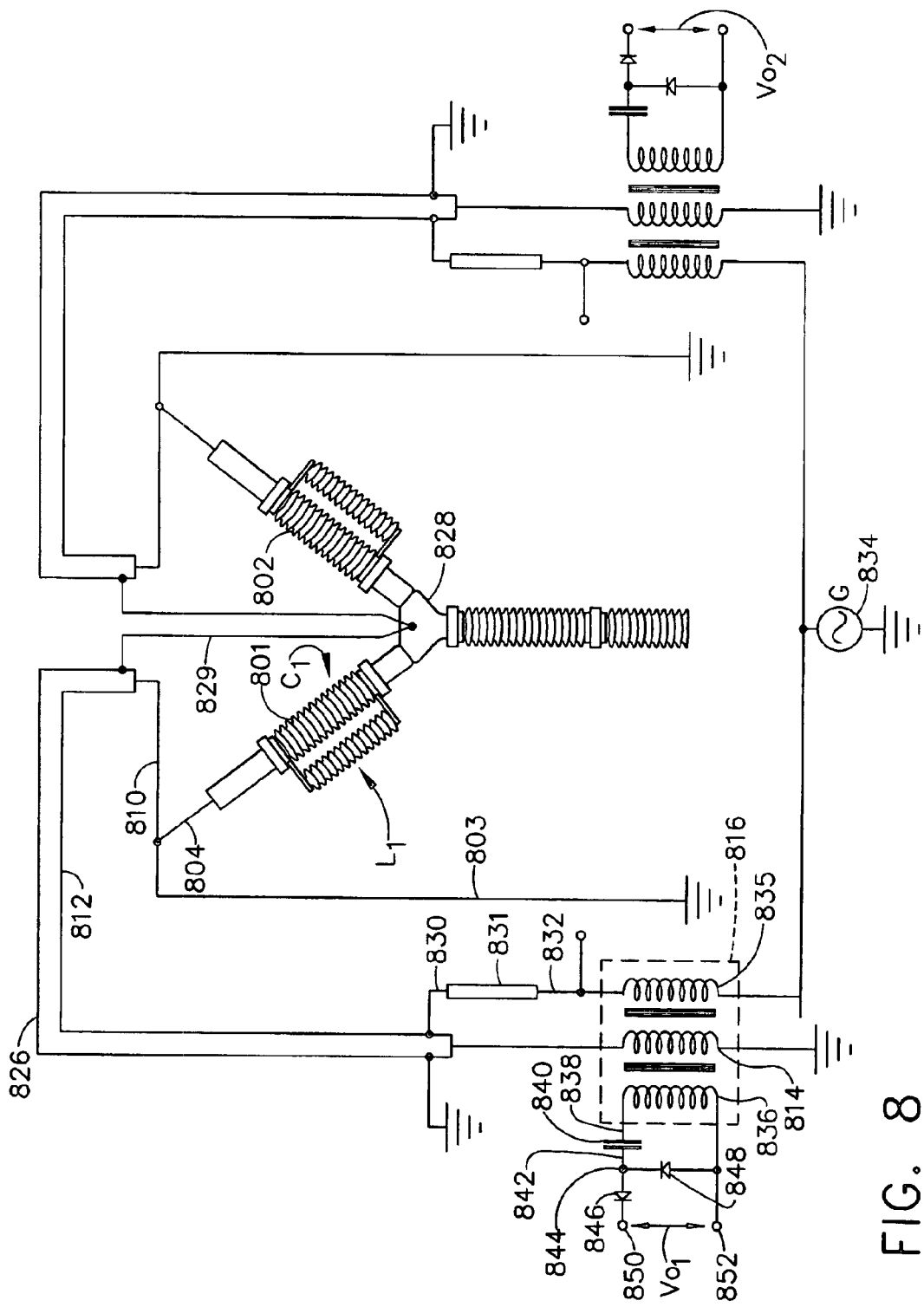
FIG. 8 is a schematic illustration of an alternative testing circuit 800 that may be used to time the contacts of the circuit breaker phase shown in FIG. 1.

FIG. 8 is a schematic illustration of an alternative testing circuit 800 that may be used to time the contacts of circuit breaker phase 100 (shown in FIG. 1). In the exemplary embodiment, testing circuit 800 includes two sub-circuits, one for a line side 801 of circuit breaker phase 100 and one sub-circuit for a load side 802 of circuit breaker phase 100. Each sub-circuit is substantially similar, such that only one sub-circuit will be described. A first electrical ground cable 803 is electrically coupled at one end to a line side circuit breaker lead 804 and at a second end to electrical ground. Line side circuit breaker lead 804 is also electrically coupled to electrical ground through a signal conductor 810 of a test cable 812 and through a winding 814 of a transformer 816. A shield 826 of test cable 812 is electrically coupled at one end to circuit breaker phase 100 moving contact actuator housing 828 through jumper 829, and at a second end, shield 826 is electrically coupled to electrical ground and to a first lead 830 of a dropping resistor 831. A second lead of dropping resistor 831 is coupled to a sine wave generator 834 through a second winding 835 of transformer 816. A third winding 836 of transformer 816 is electrically coupled at one end to a first terminal 838 of a capacitor 840. A second terminal 842 of capacitor 840 is electrically coupled to a node 844. Node 844 is electrically coupled to an anode of a diode 846 and a cathode of a diode 848. A cathode of diode 846 is coupled to a voltage output terminal 850. A voltage output terminal 852 is electrically coupled to an anode of diode 848 and a second end of winding 836.

In the exemplary embodiment, during testing, both of line side 801 and load side 802 of circuit breaker phase 100 may be grounded. A high voltage circuit breaker when removed from service for maintenance, testing, or other reason may be grounded on both sides for personnel safety precautions. In the past, it was necessary to remove at least one of the grounds when the circuit breaker operation times were tested. Grounding both sides of the circuit breaker creates short circuits between elements than are desired to find a time/voltage relationship between. In the exemplary embodiment, a generated relatively high frequency signal, for example, in the range of approximately one MHz to two MHz, may be injected into the breaker contacts, through the grounding cables. An impedance of those cables becomes enough high for the high frequency voltage source to avoid short circuit and at the same time to allow a correct timing measurement.

In the exemplary embodiment, electrical ground cable 803 has an inductance of approximately sixteen micro-Henry such that an impedance of electrical ground cable 803 may have a value between approximately one hundred Ohms and two hundred Ohms, depending on the frequency generated by sine wave generator 834. In an alternative embodiment, ferrite is added to electrical ground cable 803 such that the impedance may be increased to approximately five hundred Ohms. Because the impedance of cable 826 may be proportional to the frequency of the test voltage supplied by sine wave generator 834. To facilitate minimizing the impedance of cable 826, cable 826 may comprise a twisted pair cable or a coaxial cable.

A resonant frequency of testing circuit 800 may be determined by evaluating the inductances and capacitances of components in testing circuit 800. Accordingly, the inductances that facilitate determining circuit resonance are an inductance of electrical ground cable 803 ($L_{g1}$), an inductance of testing cable 826 ($L_{k1}$), an inductance of jumper 829 ($L_{c1}$), and an inductance that represents length of the breaker pole contacts ($L_1$). The capacitances that facilitate determining circuit resonance are a capacitance of testing cable 826 ($C_{k1}$) and a capacitance $C_1$ that represents contact capacitance and capacitance in parallel to the main contacts.

$L_1$ is in series with the main contacts and more than five times less than $L_{g1}$. $L_{k1}$ and $L_{c1}$ may be substantially minimized by reducing the length of testing cable 826 and jumper 829 as short as possible. With $L_{k1}$ and $L_{c1}$ minimized, only two inductive components will be important for resonance in the sub-circuit, $L_1$ and $L_{g1}$. However, when the circuit breaker is in an open position, only the $L_{g1}$ value may be dominant.

A resonant frequency value may be determined by tuning an oscillator within sine wave generator 834 wherein a maximum deflection in output voltage ($V_{o1}$) is monitored during tuning and the value registered represents an initial value for a circuit breaker timing measurement.

A common sine wave generator 834 may be used to supply both sub-circuits for testing both circuit breaker elements by using transformer 816 and a respective other transformer for supplying the other sub-circuit. The output signal from transformer 816 may be differentiated using capacitor 840 to minimize power line frequency interference, and rectified such that $V_{o1}$ represents an output signal that may be used for an input to microprocessor 314 (shown in FIG. 3). The capacitance in parallel to the main contacts component of $C_1$ does not adversely impact the timing determination because the capacitance value is substantially constant during the circuit breaker operation and the capacitance value is included in the resonance of the sub-circuit.

During operation of the circuit breaker contacts, for example, from an open position to a close position, capacitance in the sub-circuit may increase, and the equivalent impedance may decrease until a first contact touch, when the values of $V_{o1}$ and $V_{o2}$ may attain a value. By recording, processing and analyzing values for $V_{o1}$ relative to $V_{o2}$, a first contact touch may be determined. A maximum value of capacitance in the sub-circuit may represent a minimum distance between the contacts of each contact pair. In addition to providing accurate timing of the contact first opening and first closing, currents through transformer 816 and the respective other transformer supplying the other sub-circuit may be recorded and analyzed to determine a condition of the contact surfaces of each contact pair. To measure current through transformer 816 a voltage across resistor 831 may be made to determine a dynamic resistance measurement.

Figure 9:
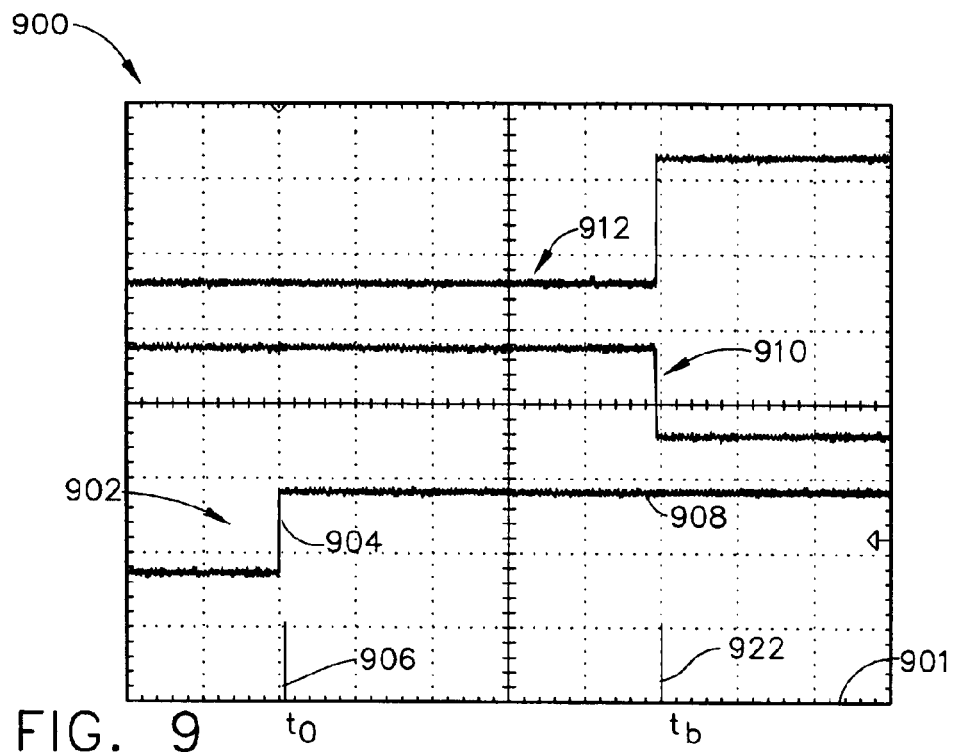
FIG. 9 is an illustration of an oscillograph of an exemplary circuit breaker operation using the testing circuit shown in FIG. 8.

FIG. 9 is an illustration of an oscillograph 900 of an exemplary circuit breaker operation using testing circuit 800 (shown in FIG. 8). Oscillograph 900 includes an x-axis 901, representing time (t), divided into divisions of approximately 20 milliseconds per division. Oscillograph 900 illustrates a trace 902 of voltage on a close coil contact (not shown), which may be used as a trigger signal to begin a circuit breaker timing test. Trace 902 is at a first relatively low amplitude level 904. At a start ($t_o$) 906 of the circuit breaker timing test, the voltage amplitude level on the close coil steps to a second, relatively higher voltage amplitude level 908. Oscillograph 900 also illustrates a trace 910 of a digital output of testing circuit 800 and a trace 912 of an analog output of testing circuit 800. Each trace 910 and 912 transitions from an initial voltage level 914 and 916, respectively, at the start 906 of the test to a second voltage level 918 and 920, respectively, at a time $T_b$ 922 when testing circuit 800 detects a contact first touch of the circuit breaker contact pair.

Figure 10:
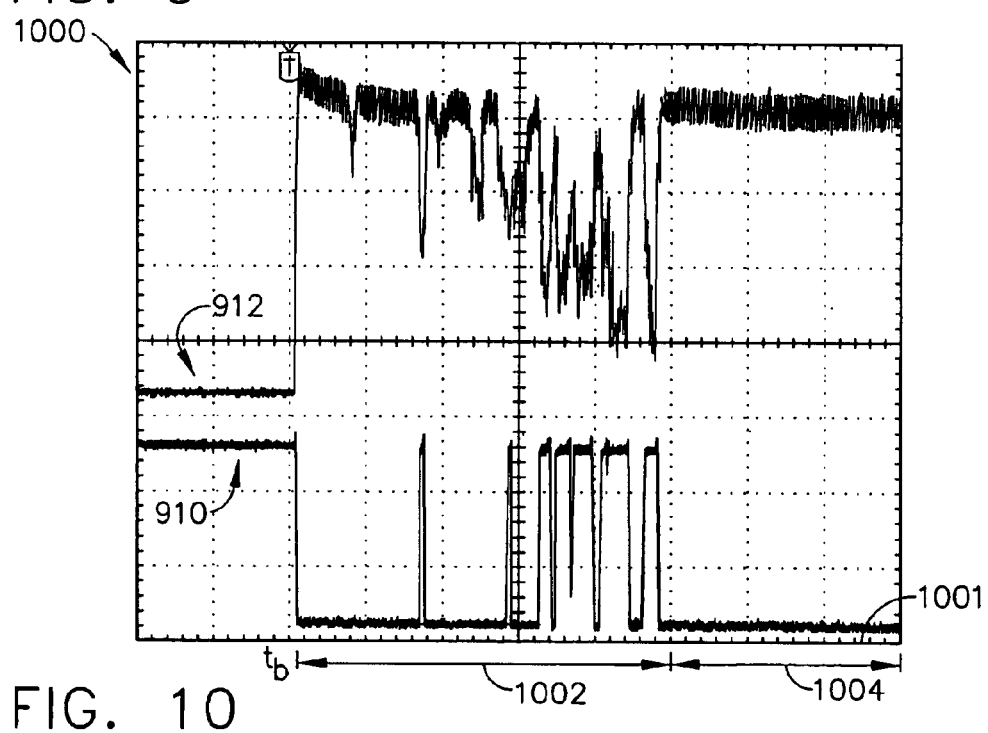
FIG. 10 illustrates a detailed oscillograph of the oscillograph shown in FIG. 9.

FIG. 10 illustrates a detailed oscillograph 1000 of oscillograph 900 (shown in FIG. 9). Oscillograph 1000 includes an x-axis 1002, representing time (t), divided into divisions of approximately 200 microseconds per division. Trace 912 illustrates a contact closure problem known as "contact bounce" during a time period 1001. After an initial closure at time $t_b$, the contacts separate slightly or maintain contact at a relatively reduced contact pressure than a predetermined design contact pressure. After time period 1002, contact pressure may settle at the predetermined design contact pressure or may settle at a contact pressure less than the predetermined design contact pressure, for example, during a time period 1004. Accordingly, Oscillograph 1000 may be used with other testing circuit measured parameters, such as but not limited to, contact timing and contact current, to analyze circuit breaker component condition and circuit breaker contact condition.

While the present invention is described with reference to measuring timing and resistance of contacts of a high voltage circuit breaker, numerous other applications are contemplated. For example, it is contemplated that the present invention may be applied to any system wherein electromagnetic interference may induce currents into measured parameters and measuring devices such that the accuracy of such measurements is reduced without suppression of the induced currents.

A technical effect of the circuit breaker testing systems and methods described herein include at least one of facilitating monitoring and control of circuit breaker devices during testing, conducting testing from a single interface including broadcasting control commands to the circuit breaker components and receiving circuit breaker signals, and processing circuit breaker component data to provide a status of a plurality of circuit breaker components.

The above-described high voltage circuit breaker testing system is cost-effective and highly reliable for determining a circuit breaker contact timing and resistance in the presence of induced currents from electromagnetic interference and while the circuit breaker load-side and line-side contacts remain electrically grounded. More specifically, the methods and systems described herein facilitate determining circuit breaker operating times and contact resistances accurately in the presence of electromagnetic induced currents in the circuit breaker circuit and testing circuit. In addition, the above-described methods and systems facilitate providing an accurate and repeatable circuit breaker timing and contact resistance measurement while the circuit breaker is grounded through the line side and load side leads such that grounding is not provided through the testing equipment, minimizing inductance in testing cables, eliminating power line frequency interference, and ignoring an influence of a capacitor in parallel with breaker contacts. As a result, the methods and systems described herein facilitate maintaining high voltage circuit breakers in a cost-effective and reliable manner.

Exemplary embodiments of circuit breaker testing systems are described above in detail. The systems are not limited to the specific embodiments described herein, but rather, components of each system may be utilized independently and separately from other components described herein. Each system component can also be used in combination with other system components.

While the invention has been described in terms of various specific embodiments, those skilled in the art will recognize that the invention can be practiced with modification within the spirit and scope of the claims.

What is claimed is:

1. A method for analyzing at least one electrical contact pair electrically coupled in series wherein the at least one contact pair includes at least one of a contact that is electrically coupled to a line-side of the at least one contact pair, and a contact that is electrically coupled to a load-side of the at least one contact pair, said method comprising:

electrically coupling the load-side contact and the line-side contact to electrical ground;

applying a test voltage across the contact pair while the line-side contact and load-side contact remain electrically coupled to electrical ground;

triggering a contact pair operation timer at a start of a test;

detecting at least one of a first closure of the contact pair and a first opening of the contact pair using the test voltage; and determining the timing of the contact pair based upon the operation of the contact pair operation timer.

2. A method in accordance with claim 1 wherein applying a test voltage across the contact pair comprises applying an alternating current test voltage across the contact pair.

3. A method in accordance with claim 1 wherein applying a test voltage across the contact pair comprises applying an alternating current test voltage having a frequency of greater than approximately fifty Hertz across the contact pair.

4. A method in accordance with claim 1 wherein applying a test voltage across the contact pair comprises applying an alternating current test voltage having a frequency of greater than approximately one kilo-Hertz across the contact pair.

5. A method in accordance with claim 1 herein applying a test voltage across the contact pair comprises applying an alternating current test voltage having a frequency of greater than approximately one mega-Hertz across the contact pair.

6. A method in accordance with claim 1 herein applying a test voltage across the contact pair comprises applying an alternating current test voltage having a frequency of between approximately one mega-Hertz and approximately two mega-Hertz across the contact pair.

7. A method in accordance with claim 1 wherein the test voltage is applied to the contact pair through a testing circuit and wherein applying a test voltage across the contact pair further comprises determining the resonant frequency of the testing circuit.

8. A method in accordance with claim 7 wherein determining the resonant frequency of the testing circuit comprises tuning the alternating current test voltage frequency such that an output signal of the testing circuit is substantially at a maximum output value.

9. A method in accordance with claim 1 wherein applying a test voltage across the contact pair while the line-side contact and load-side contact remain electrically coupled to electrical ground comprises applying an alternating current test voltage across the contact pair having a frequency of approximately a resonant frequency of the testing circuit.

10. A method in accordance with claim 1 further comprising determining, for the at least one contact pair, at least one of a contact movement, a contact status, and a parameter value indicative of a health of the at least one contact pair.

11. A method for analyzing a circuit breaker having at least one contact pair including a load-side contact and a line-side contact, said method comprising:

electrically coupling the load-side contact and the line-side contact to electrical ground;

applying an alternating current test voltage having a frequency of between approximately one mega-Hertz and approximately two mega-Hertz across the circuit breaker contact pair while the load-side contact and the line-side contact remain electrically coupled to electrical ground;

starting a circuit breaker test including triggering a contact pair operation timer;

triggering the contact pair operation timer based on at least one of a first closure of the contact pair and a first opening of the contact pair; and determining the timing of the contact pair based upon the operation of the contact pair operation timer.

12. A method in accordance with claim 11 wherein the test voltage is applied to the contact pair through a testing circuit, wherein applying a test voltage across the contact pair comprises applying an alternating current test voltage across the contact pair at approximately a resonant frequency of the testing circuit.

13. A method in accordance with claim 11 further comprising determining, for the at least one contact pair, at least one of a contact movement, a contact status, and a parameter value indicative of a health of the at least one contact pair.

14. A circuit breaker test device for analyzing contacts of a circuit breaker, said test device comprising:

a test voltage source configured to supply a test voltage to a load-side contact and a line-side contact of the circuit breaker;

a sensing circuit coupled to said test voltage source, said sensing circuit configured to monitor an output of said test voltage source;

a microprocessor coupled to an output of said sensing circuit, said microprocessor configured to receive the output of said sensing circuit;

a ground circuit electrically coupled to the load-side contact of the circuit breaker; and a ground circuit electrically coupled to the line-side contact of the circuit breaker.

15. A circuit breaker test device in accordance with claim 14 wherein said microprocessor is programed to at least one of analyze data contained within the output of said sensing circuit, control parameters of said test voltage source, receive commands from an operator, execute scripts that include automatic testing procedures, and generate testing data output.

16. A circuit breaker test device in accordance with claim 14 wherein said test voltage source is configured to supply a selectably variable test voltage at a predetermined frequency.

17. A circuit breaker test device in accordance with claim 16 wherein said test voltage source is configured to supply a test voltage at a frequency greater than approximately one kiloHertz.

18. A circuit breaker test device in accordance with claim 17 wherein said test voltage source is configured to supply a test voltage at a frequency greater than approximately one mega-Hertz.

19. A circuit breaker test device in accordance with claim 18 wherein said test voltage source is configured to supply a test voltage at a frequency between approximately one mega-Hertz and approximately two mega-Hertz.

20. A circuit breaker test device in accordance with claim 14 wherein said sensing circuit comprises:

a transformer comprising a first winding coupled to said test voltage source; and a resistor coupled to said first winding, said resistor configured to drop test voltage source voltage for measuring current through said first winding.

21. A circuit breaker test device in accordance with claim 20 wherein said transformer further comprises a second winding magnetically coupled to said first winding, said second winding coupled to at least one of said line-side contact and said load-side contact.

22. A circuit breaker test device in accordance with claim 20 wherein said transformer further comprises a third winding magnetically coupled to said second winding, said third winding coupled to a sensing circuit output.

23. A circuit breaker test device in accordance with claim 22 wherein said sensing circuit output comprises:

a differentiating circuit configured to filter power line interference from a sensing circuit output signal; and a rectifier circuit configured to rectify the sensing circuit output signal.

24. A circuit breaker test device in accordance with claim 22 wherein said differentiating circuit comprises a capacitor in series with the sensing circuit output.

25. A circuit breaker test device in accordance with claim 22 wherein said rectifier circuit comprises a pair of oppositely-poled diodes.

26. A circuit breaker test device in accordance with claim 14 wherein said microprocessor is programmed to determine at least one of a contact movement, a contact status, and a parameter value indicative of a health of the at least one contact pair using data contained within the output of said sensing circuit.

27. A circuit breaker test device comprising:
- a selectable frequency test voltage source configured to generate a circuit breaker test signal;
- a sensing circuit coupled to said test voltage source output comprising a transformer, a differentiating circuit, and a rectifying circuit, said sensing circuit configured to:
  - transmit the circuit breaker test signal to at least one of a circuit breaker load-side contact and a circuit breaker line-side contact;
  - receive a circuit breaker contact test signal in response to the circuit breaker test signal; and
  - transmit the circuit breaker contact test signal to an output of said sensing circuit;
- a grounding cable comprising a coaxial cable wherein a signal conductor first end is coupled to electrical ground through a first winding of said transformer, a signal conductor second end is coupled to said at least one of a circuit breaker load-side contact and a circuit breaker line-side contact, a shield conductor first end is coupled to said test voltage source through a second winding of said transformer, and a shield conductor second end is coupled to said circuit breaker; and
- a microprocessor coupled to said output of said sensing circuit, said microprocessor configured to at least one of analyze data contained within the output of said sensing circuit, control parameters of said test voltage source, receive commands from an operator, execute scripts that include automatic testing procedures, and generate testing data output.

* * * * *

UNITED STATES PATENT AND TRADEMARK OFFICE
CERTIFICATE OF CORRECTION

PATENT NO.       : 6,963,203 B2
APPLICATION NO.  : 10/764243
DATED            : November 8, 2005
INVENTOR(S)      : Stanisic et al.

It is certified that error appears in the above-identified patent and that said Letters Patent is hereby corrected as shown below:

In Claim 15, column 12, line 24, delete "programmed" and insert therefor
-- programmed --.

Signed and Sealed this

Sixth Day of November, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,963,203 B2 |
| APPLICATION NO. | : 10/764243 |
| DATED | : November 8, 2005 |
| INVENTOR(S) | : Stanisic et al. |

It is certified that error appears in the above-identified patent and that said Letters Patent is hereby corrected as shown below:

In Claim 15, column 12, line 24, delete "programed" and insert therefor -- programmed --.

Signed and Sealed this

Twelfth Day of May, 2009

JOHN DOLL
*Acting Director of the United States Patent and Trademark Office*